(12) United States Patent
Chen et al.

(10) Patent No.: US 11,158,743 B2
(45) Date of Patent: Oct. 26, 2021

(54) PASSIVATED AND FACETED FOR FIN FIELD EFFECT TRANSISTOR

(71) Applicant: Taiwan Semiconductor Manufacturing Company, Ltd., Hsinchu (TW)

(72) Inventors: Yen-Yu Chen, Taipei (TW); Chi-Yuan Shih, Hsinchu (TW); Chi-Wen Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 66 days.

(21) Appl. No.: 16/538,496

(22) Filed: Aug. 12, 2019

(65) Prior Publication Data
US 2019/0363191 A1   Nov. 28, 2019

Related U.S. Application Data

(60) Continuation of application No. 15/620,499, filed on Jun. 12, 2017, now Pat. No. 10,381,482, which is a
(Continued)

(51) Int. Cl.
*H01L 29/78* (2006.01)
*H01L 29/66* (2006.01)
(Continued)

(52) U.S. Cl.
CPC .. *H01L 29/7851* (2013.01); *H01L 21/823431* (2013.01); *H01L 21/823481* (2013.01); *H01L 23/291* (2013.01); *H01L 23/3171* (2013.01); *H01L 27/0886* (2013.01); *H01L 29/0649* (2013.01); *H01L 29/1054* (2013.01); *H01L 29/165* (2013.01); *H01L 29/66795* (2013.01);
(Continued)

(58) Field of Classification Search
CPC ............ H01L 29/7851; H01L 29/7853; H01L 29/7854; H01L 21/823431; H01L 21/823481; H01L 23/291; H01L 23/3171; H01L 27/0886; H01L 229/0649; H01L 29/1054; H01L 29/165; H01L 29/66795–66818
See application file for complete search history.

(56) References Cited

U.S. PATENT DOCUMENTS 6,475,869 B1   11/2002   Yu
8,519,481 B2   8/2013   Yuan et al.
(Continued)

FOREIGN PATENT DOCUMENTS

CN   1645629 A   7/2005
CN   101924133 A   12/2010
(Continued)

*Primary Examiner* — Grant S Withers
(74) *Attorney, Agent, or Firm* — Slater Matsil, LLP

(57) ABSTRACT

A fin field effect transistor (FinFET), and a method of forming, is provided. The FinFET has a fin having one or more semiconductor layers epitaxially grown on a substrate. A first passivation layer is formed over the fins, and isolation regions are formed between the fins. An upper portion of the fins are reshaped and a second passivation layer is formed over the reshaped portion. Thereafter, a gate structure may be formed over the fins and source/drain regions may be formed.

13 Claims, 10 Drawing Sheets

Related U.S. Application Data continuation of application No. 15/018,245, filed on Feb. 8, 2016, now Pat. No. 9,680,021, which is a division of application No. 14/051,033, filed on Oct. 10, 2013, now Pat. No. 9,287,262.

(51) Int. Cl.
*H01L 21/8234* (2006.01)
*H01L 27/088* (2006.01)
*H01L 29/165* (2006.01)
*H01L 23/29* (2006.01)
*H01L 23/31* (2006.01)
*H01L 29/06* (2006.01)
*H01L 29/10* (2006.01)

(52) U.S. Cl.
CPC ........ *H01L 29/785* (2013.01); *H01L 29/7853* (2013.01); *H01L 29/7854* (2013.01); *H01L 2924/0002* (2013.01)

(56) References Cited

U.S. PATENT DOCUMENTS

| | | | |
|---|---|---|---|
| 8,883,585 | B1 | 11/2014 | Fumitake |
| 8,889,500 | B1 | 11/2014 | Kamineni et al. |
| 8,952,420 | B1 | 2/2015 | Loubet et al. |
| 9,219,115 | B2 | 12/2015 | Colinge |
| 2003/0173641 | A1 | 9/2003 | Ohta et al. |
| 2004/0219722 | A1 | 11/2004 | Pham et al. |
| 2005/0145932 | A1 | 7/2005 | Park et al. |
| 2005/0156202 | A1 | 7/2005 | Rhee et al. |
| 2005/0158934 | A1 | 7/2005 | Yun et al. |
| 2005/0173768 | A1 | 8/2005 | Lee et al. |
| 2006/0118876 | A1 | 6/2006 | Lee et al. |
| 2006/0189058 | A1 | 8/2006 | Lee et al. |
| 2007/0048934 | A1 | 3/2007 | Kim et al. |
| 2007/0158764 | A1 | 7/2007 | Orlowski et al. |
| 2007/0167024 | A1 | 7/2007 | Li et al. |
| 2008/0135888 | A1 | 6/2008 | Lee et al. |
| 2008/0296648 | A1 | 12/2008 | Zhu |
| 2010/0052043 | A1 | 3/2010 | Lee |
| 2010/0258870 | A1 | 10/2010 | Hsu et al. |
| 2011/0073952 | A1 | 3/2011 | Kwok et al. |
| 2011/0074340 | A1 | 3/2011 | Kao |
| 2011/0081764 | A1 | 4/2011 | Maszara et al. |
| 2011/0084340 | A1 | 4/2011 | Yuan et al. |
| 2011/0097889 | A1* | 4/2011 | Yuan ............... H01L 21/845 438/595 |
| 2011/0140229 | A1 | 6/2011 | Rachmady et al. |
| 2011/0175149 | A1 | 7/2011 | Kim et al. |
| 2011/0198700 | A1 | 8/2011 | Park et al. |
| 2012/0074386 | A1 | 3/2012 | Rachmady et al. |
| 2012/0091538 | A1 | 4/2012 | Lin et al. |
| 2012/0168830 | A1 | 7/2012 | Usuda et al. |
| 2012/0319211 | A1 | 12/2012 | van Dal et al. |
| 2013/0001591 | A1* | 1/2013 | Wu ............... H01L 21/823821 257/77 |
| 2013/0093026 | A1 | 4/2013 | Wann et al. |
| 2013/0228830 | A1 | 9/2013 | Lee et al. |
| 2013/0228876 | A1* | 9/2013 | Mor ............... H01L 29/7848 257/401 |
| 2013/0234203 | A1 | 9/2013 | Tsai et al. |
| 2013/0256764 | A1 | 10/2013 | Liaw |
| 2013/0277686 | A1 | 10/2013 | Liu et al. |
| 2014/0027816 | A1 | 1/2014 | Cea et al. |
| 2014/0042500 | A1 | 2/2014 | Wann et al. |
| 2014/0138770 | A1 | 5/2014 | van Dal et al. |
| 2014/0197493 | A1 | 7/2014 | Tsai et al. |
| 2014/0203370 | A1 | 7/2014 | Maeda et al. |
| 2014/0225065 | A1 | 8/2014 | Rachmady et al. |
| 2014/0239354 | A1 | 8/2014 | Huang et al. |
| 2014/0246731 | A1 | 9/2014 | Chen et al. |
| 2014/0256105 | A1 | 9/2014 | Wann et al. |
| 2014/0273360 | A1 | 9/2014 | Cheng et al. |
| 2014/0299934 | A1 | 10/2014 | Kim et al. |
| 2014/0353719 | A1 | 12/2014 | Kim |
| 2014/0361336 | A1 | 12/2014 | Chen et al. |
| 2014/0374827 | A1 | 12/2014 | Suh et al. |
| 2014/0374838 | A1 | 12/2014 | Chen et al. |
| 2014/0377922 | A1 | 12/2014 | Fung |
| 2015/0028426 | A1 | 1/2015 | Ching et al. |
| 2015/0054039 | A1 | 2/2015 | Ching et al. |
| 2016/0329329 | A1 | 11/2016 | Chen et al. |

FOREIGN PATENT DOCUMENTS

| | | |
|---|---|---|
| CN | 102832236 A | 12/2012 |
| KR | 20060062048 A | 6/2006 |
| KR | 1020070000758 A | 1/2007 |

* cited by examiner

PASSIVATED AND FACETED FOR FIN FIELD EFFECT TRANSISTOR

This application is a continuation of U.S. patent application Ser. No. 15/620,499, entitled "Passivated and Faceted for Fin Field Effect Transistor" filed on Jun. 12, 2017, now U.S. Pat. No. 10,381,482 issued Aug. 13, 2019, which is a continuation of U.S. patent application Ser. No. 15/018,245, entitled "Passivated and Faceted for Fin Field Effect Transistor" filed on Feb. 8, 2016, now U.S. Pat. No. 9,680,021 issued Jun. 13, 2017, which is a divisional of U.S. patent application Ser. No. 14/051,033, now U.S. Pat. No. 9,287,262, entitled "Passivated and Faceted for Fin Field Effect Transistor" filed on Oct. 10, 2013, now U.S. Pat. No. 9,287,262 issued Mar. 15, 2016, which applications are hereby incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, interface traps between fins and shallow-trench-isolation (STI) oxide cause high leakage current of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
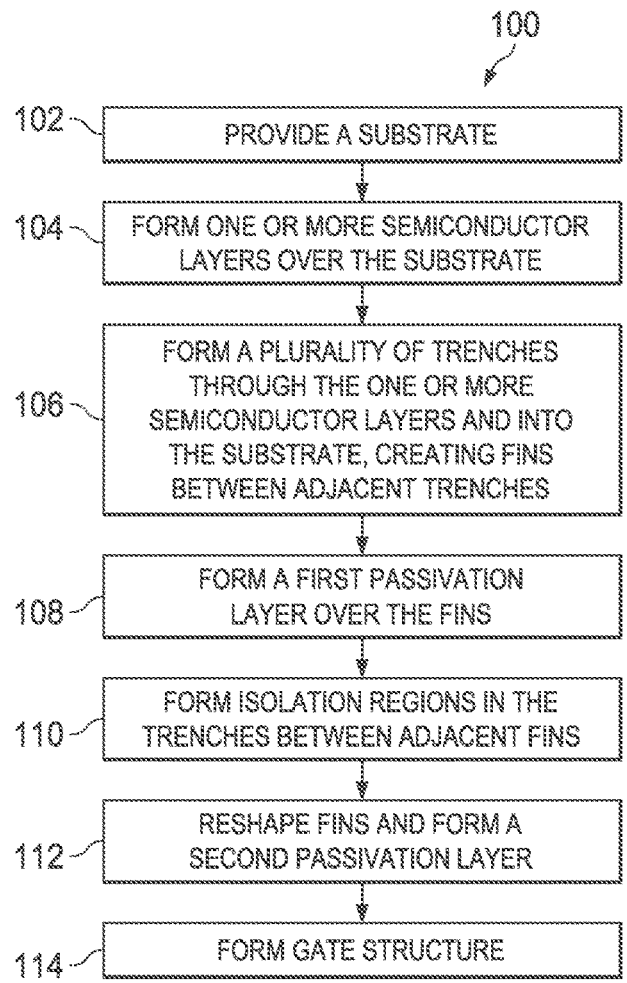
FIG. 1 is a flowchart illustrating a method of fabricating a FinFET according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a fin field effect transistor (FinFET) according to various aspects of the present disclosure. The method 100 begins with step 102 in which a substrate, such as a silicon substrate, is provided. The method 100 continues with step 104 in which one or more semiconductor layers are formed over the substrate. In an embodiment, such as that disclosed below with reference to FIGS. 3-10, the one or more semiconductor layers comprise a silicon germanium epitaxially grown over the substrate and a germanium layer epitaxially grown over the silicon germanium layer. In another embodiment, such as that disclosed below with reference to FIGS. 11-18, a silicon germanium layer (gradient or uniform) is formed over the substrate. In yet another embodiment, such as that disclosed below with reference to FIGS. 19-26, the one or more semiconductor layers comprise a plurality of silicon germanium layers having differing concentrations of germanium.

In step 106, a plurality of trenches is formed through the one or more semiconductor layers and into the substrate, wherein fins are created between adjacent trenches. A first passivation layer, such as an oxynitride layer, is formed over the fins in step 108, followed by isolation regions being formed by depositing a dielectric material in the trenches in step 110. Exposed portions of the fins are reshaped and a second passivation layer, such as an oxynitride layer, is formed over the reshaped fins in step 112. Thereafter, a gate structure is formed in step 114. The discussion that follows illustrates embodiments of FinFETs that can be fabricated according to the method 100 of FIG. 1.

Figure 2:
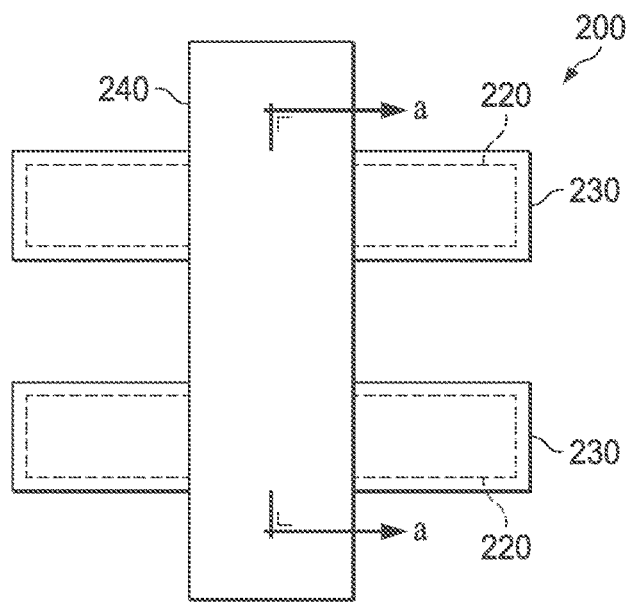
FIG. 2 shows a top view of a FinFET comprising a passivation structure according to various aspects of the present disclosure.

FIG. 2 shows a top view of a fin field effect transistor (FinFET) 200 comprising a passivation structure 230 formed over a fin structure 220 according to various aspects of the present disclosure. FIGS. 3-26 are cross-sectional views of a FinFET 200 taken along the line a-a of FIG. 2 at various stages of fabrication according to various embodiment of the present disclosure. As employed in the present disclosure, the FinFET 200 refers to any fin-based, multi-gate transistor. Other transistor structures and analogous structures are within the contemplated scope of the disclosure. The FinFET 200 may be included in a microprocessor, memory cell, and/or other integrated circuit (IC).

It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that other processes may only be briefly described herein. Also, FIGS. 1-26 are simplified for a better understanding of the concepts of the present disclosure. For example, although the figures illustrate the FinFET 200, it is understood the IC may comprise a number of other devices comprising resistors, capacitors, inductors, fuses, etc.

FIG. 2 illustrates a FinFET 200 fabricated using the steps in FIG. 1. For illustration, the FinFET 200 comprises a fin structure 220 (dashed line), a passivation structure 230 surrounding the fin structure 220 and a gate structure 240 traversing over a channel portion of the fin structure 220. For illustration, the FinFET 200 comprises two fins. In some embodiments, the FinFET 200 may comprise less than or greater than two fins, for example, one fin or three fins.

Figure 3:
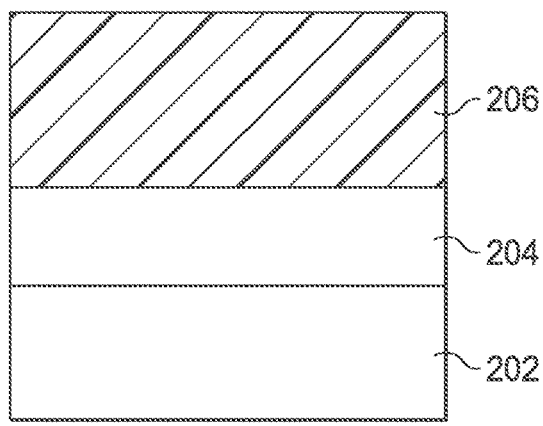
FIGS. 3-10 are cross-sectional views of a FinFET at various stages of fabrication according to various embodiments of the present disclosure.

FIGS. 3-10 illustrate various cross-sectional views of intermediate steps of fabricating a FinFET device in accordance with an embodiment. Referring first to FIG. 3 and step 102 in FIG. 1, a substrate 202 is provided, wherein the substrate 202 comprises a first semiconductor material having a first lattice constant and hence is also referred to as first semiconductor material 202 in the present disclosure. In one embodiment, the substrate 202 comprises a crystalline silicon substrate (e.g., wafer). In alternative embodiments, the substrate 202 comprises a silicon-on-insulator (SOI) structure. The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

Still referring to FIG. 3, a second semiconductor material 204 (such as silicon germanium layer 204) epitaxially grown over the silicon substrate 202 (step 104 in FIG. 1), wherein the second semiconductor material 204 has a second lattice constant greater than the first lattice constant. For example, in an embodiment, the substrate 202 may be a silicon wafer and the second semiconductor material 204 is a silicon germanium layer. In this example, the germanium layer has about 25% to about 75% germanium, and may have a strained or fully relaxed surface. Additionally, the second semiconductor material 204 may be a uniform layer having a uniform concentration of, for example, germanium, or a gradient layer wherein the concentration of, for example, germanium varies.

In an embodiment, the second semiconductor material 204 (such as silicon germanium layer) is selectively grown by a chemical vapor deposition (CVD) process, such as a low-pressure CVD (LPCVD). In one embodiment, the LPCVD process is performed at a temperature of about 350° C. to about 800° C. and under a pressure of about 1 mTorr to about 760 Torr, using, for example, $SiH_4$, $Si_2H_6$, or the like as a silicon precursor and $GeH_4$, $Ge_2H_6$, or the like as a germanium precursor. In some embodiments, the silicon germanium layer 204 has a thickness ranging from about 10 nm to about 50 nm.

Still referring to FIG. 3, a third semiconductor material 206 (such as a germanium layer) is epitaxially grown over the second semiconductor material 204 (step 104 in FIG. 1), wherein the third semiconductor material 206 has a third lattice constant greater than the second lattice constant. As such, the second lattice constant is between the first lattice constant and the third lattice constant. In an embodiment, the third semiconductor material 206 comprises a germanium layer selectively grown by an LPCVD process. In an embodiment, the LPCVD process is performed at a temperature of about 200° C. to about 700° C. and under a pressure of about 1 mTorr to about 760 Torr, using $GeH_4$ or $Ge_2H_6$ as a precursor. In some embodiments, the third semiconductor material 206 has a thickness ranging from about 10 nm to about 50 nm. In an embodiment, a surface of the third semiconductor material 206 is fully relaxed.

For convenience, the second semiconductor material 204 is also referred to herein as the silicon germanium layer 204, and the third semiconductor material 206 is also referred to herein as the germanium layer 206. It should be noted, however, that other embodiments may utilize other materials, such as other group III-V materials, SiC, and the like.

Figure 4:
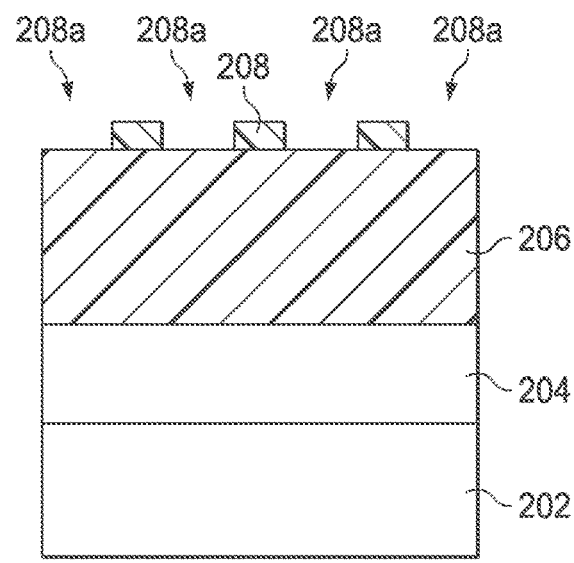
Figure 5:
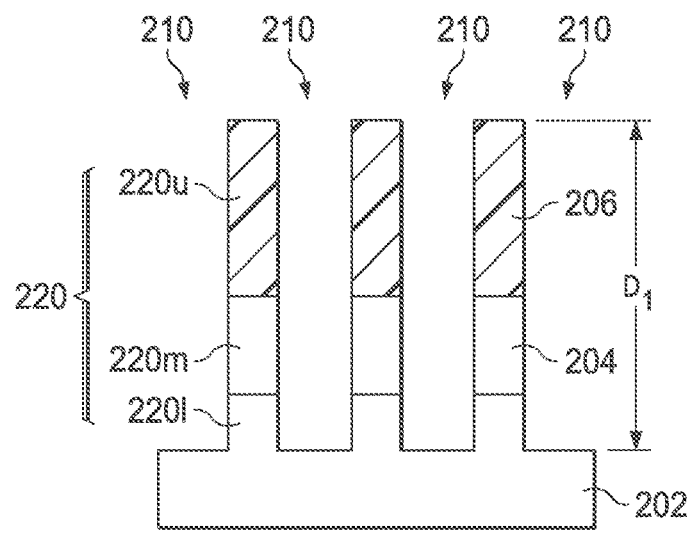

FIGS. 4-5 illustrate forming a plurality of trenches (such as trenches 210 in FIG. 5) into the substrate 202, the silicon germanium layer 204, and the germanium layer 206 in accordance with an embodiment, similar to that discussed above with reference to step 106 in FIG. 1. Referring first to FIG. 4, there is shown a patterned mask 208 defining openings 208a. In an embodiment, the patterned mask 208 is a photoresist layer that has been deposited, exposed, and developed. Other masking layers, such as oxide and/or nitride hard mask layers, may also be used.

The exposed germanium layer 206 is then etched to form a plurality of trenches 210. In some embodiments, the plurality of trenches 210 extends through the germanium layer 206, silicon germanium layer 204, and into the silicon substrate 202. In some embodiments, the trenches 210 may be strips (viewed from the top of the FinFET 200) parallel to each other, and closely spaced with respect to each other. In some embodiments, the trenches 210 may be continuous and surrounding the remaining germanium layer 206 and remaining silicon germanium layer 204. In some embodiments, the etching process may be performed using $CF_4$, HBr, $CH_3F$, $SF_6$, a mixture thereof, or the like as an etching gas, a carrier gas such as He or the like, and an passivation gas such as $O_2$ or the like. In an embodiment the process gas may be a combination of the etching gas, a carrier gas, and a passivation gas and may be used to etch the Ge, SiGe, and the Si material, although at different etch rates. In an embodiment, the trenches 210 may have a depth D1 of about 20 nm to about 120 nm.

In the depicted embodiments, the remaining germanium layer 206, remaining silicon germanium layer 204, and remaining silicon substrate 202 between trenches 210 are form a fin structure 220 (shown in FIG. 5). Further, the remaining germanium layer 206 is hereinafter referred to as an upper fin portion 220u. The remaining silicon germanium layer 204 is hereinafter referred to as a middle fin portion 220m. The protruding sections of the substrate 202 between trenches 210 are hereinafter referred to as a lower fin portion 220l.

As such, the fin structure 220 comprises a lower fin portion 220l comprising a first semiconductor material 202 having a first lattice constant; a middle fin portion 220m comprising a second semiconductor material 204 having a second lattice constant greater than the first lattice constant; and an upper fin portion 220u comprising a third semiconductor material 206 having a third lattice constant greater than the first lattice constant and the second lattice constant, wherein the middle fin portion 220m is between the lower fin portion 220l and upper fin portion 220u. In the depicted embodiment, there are three fins extending from the substrate 202.

The patterned mask 208 is removed and a cleaning process is performed. In an embodiment, an SPM clean comprising a dilute mixture of $H_2SO_4$ and $H_2O_2$ may be used. Additionally, a cleaning process using, for example, diluted hydrofluoric (DHF) acid may be performed to remove a native oxide of the silicon substrate 202.

The process steps up to this point have provided the substrate 202 having the trenches 210 surrounding the fin structure 220. Conventionally, by introducing a dielectric material, such as shallow-trench-isolation (STI) oxide, in the trenches 210, each fin of the fin structure 220 is isolated from neighboring fins. However, the step of forming the dielectric material may create interface traps between the fin and dielectric material. The generated interface traps may provide a carrier transportation path between the fin and the dielectric material and cause high leakage current of the FinFET, thereby degrading the device performance.

Accordingly, the processing discussed below forms a passivation structure on exposed surfaces of the fin structure 220 to impede generation of the interface traps between the fin and STI oxide. Problems associated with high leakage current due to high interface traps may be reduced and/or avoided. Thus, embodiments disclosed herein may achieve the desired device performance characteristics, such as low leakage.

Figure 6:
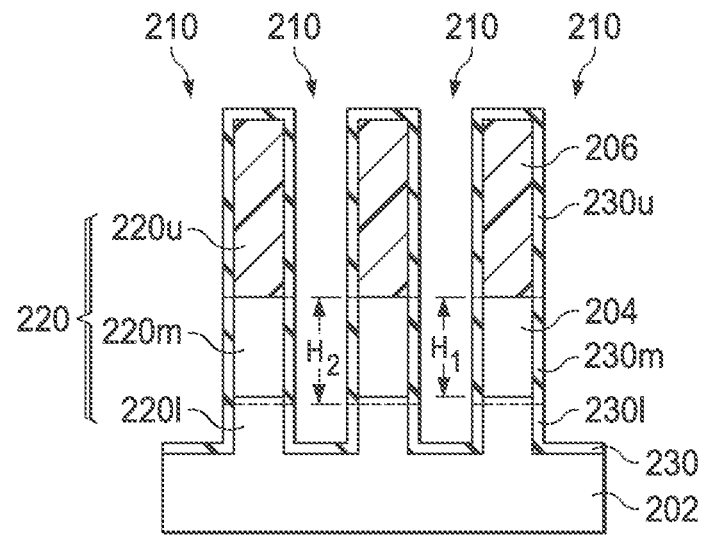

As depicted in FIG. 6, and discussed above with reference to step 108 in FIG. 1, a passivation structure is formed on exposed surfaces of the fin structure 220 to enhance device performance. In an embodiment, the passivation structure 230 is an oxynitride formed by an oxidation and nitridation process. As discussed above, the fin structure 220 may be formed of different materials, such as the silicon substrate 202, the silicon germanium layer 204 and the germanium layer 206. The oxidation and nitridation processes may react differently with these materials, forming, for example, a silicon oxynitride (SiON) layer on the silicon substrate 202, a silicon germanium oxynitride (SiGeON) on the silicon germanium layer 204, and a germanium oxynitride (GeON) on the germanium layer 206. The first passivation layer may have a thickness of about 0.5 nm to about 5 nm.

Accordingly, FIG. 6 illustrates a first passivation layer 230 comprising a lower passivation portion 230*l* over the silicon substrate 202, a middle passivation portion 230*m* over the silicon germanium layer 204, and an upper passivation portion 230*u* over the germanium layer 206. Due to the different materials, the lower passivation portion 230*l* over the silicon substrate 202 is a SiON layer, the middle passivation portion 230*m* over the silicon germanium layer 204 is a SiGeON layer, and the upper passivation portion 230*u* over the germanium layer 206 is a GeON layer.

As such, the first passivation layer 230 over the fin structure 220 comprises the lower passivation portion 230*l* over the lower fin portion 220*l* comprising an oxynitride of the first semiconductor material 202; the upper passivation portion 230*u* over the upper fin portion 220*u* comprises an oxynitride of the third semiconductor material 206; and the middle passivation portion 230*m* between the lower passivation portion 230*l* and upper passivation portion 230*u*, wherein the middle passivation portion 230*m* over the middle fin portion 220*m* comprises an oxynitride of the second semiconductor material 204.

The first passivation layer 230 acts as a buffer layer between the fin 220 and a subsequently formed insulating layer (such as STI oxide 216 in FIG. 8) to impede generation of the interface traps. Problems associated with high leakage current due to high interface traps may be reduced and/or avoided, thereby achieving better performance characteristics, such as low leakage.

In the depicted embodiment, the step of forming the first passivation layer 230 over the fin structure 220 is performed by an oxidation process, followed by a nitridation process. In some embodiments, the oxidation process comprises a rapid thermal oxidation (RTO) process, high pressure oxidation (HPO), chemical oxidation process, in-situ stream generation (ISSG) process, or enhanced in-situ stream generation (EISSG) process. In some embodiments, the RTO process is performed at a temperature of about 400° C. to about 700° C., using $O_2$ and $O_3$ as reaction gases, for about 1 second to about 30 seconds. In other embodiments, an HPO is performed using a process gas of $O_2$, $O_2+N_2$, $N_2$, or the like at a pressure from about 1 atm to about 25 atm and a temperature from about 300° C. to about 700° C. for about 1 minute to about 180 minutes. Examples of a chemical oxidation process include wet SPM clean, wet $O_3/H_2O$, or the like. The $O_3$ may have a concentration of about 1 ppm to about 50 ppm.

In some embodiments, the nitridation process comprises rapid thermal nitridation (RTN) process, high pressure nitridation (HPN), or decoupled plasma nitridation (DPN) process. In some embodiments, the RTN process is performed at a temperature of about 400° C. to about 800° C., using $NH_3$ as reaction gas, for about 1 second to about 180 seconds. In some embodiments, the HPN process is performed using a process gas of $NH_3$ at a pressure from about 1 atm to about 25 atm and a temperature from about 300° C. to about 700° C. for about 1 minute to about 180 minutes. In some embodiments, the DPN process is performed under a power of about 300 Watts to about 2250 Watts, using a process gas of $N_2$, $NH_3$, $N_2+Ar$, $N_2+He$, $NH_3+Ar$, or the like as process gases.

In some embodiments, a post nitridation anneal (PNA) process is performed after the DPN process. In some embodiments, the PNA is performed at a temperature of about 400° C. to about 700° C., using $N_2$ as anneal gas, for about 1 second to about 180 seconds. The PNA process causes the GeO to react with the N to reach a stable state, as well as driving the N deeper to create a more uniform layer.

The ratio of y:x (N:O) in the oxynitride layers (e.g., $SiO_xN_y$, $SiGeO_xN_y$, and $GeO_xN_y$) may be controlled through process condition adjustment, such as plasma power or temperature, for a particular application. In some embodiments, a ratio of y:x is between about 0.25 to about 0.90.

In some embodiments, some elements in the second semiconductor material 204 (such as germanium in the silicon germanium layer 204) may diffuse into the first semiconductor material 202 (such as the silicon substrate 202) during the nitridation process. As such, the middle passivation portion 230*m* may extend along a portion over the lower fin portion 220*l*. In some embodiments, a first height $H_1$ of the middle passivation portion 230*m* is equal to or greater than a second height $H_2$ of the middle fin portion 220*m* as illustrated in FIG. 6. In some embodiments, a ratio of the first height $H_1$ to the second height $H_2$ is from about 1 to about 1.2.

Figure 7:
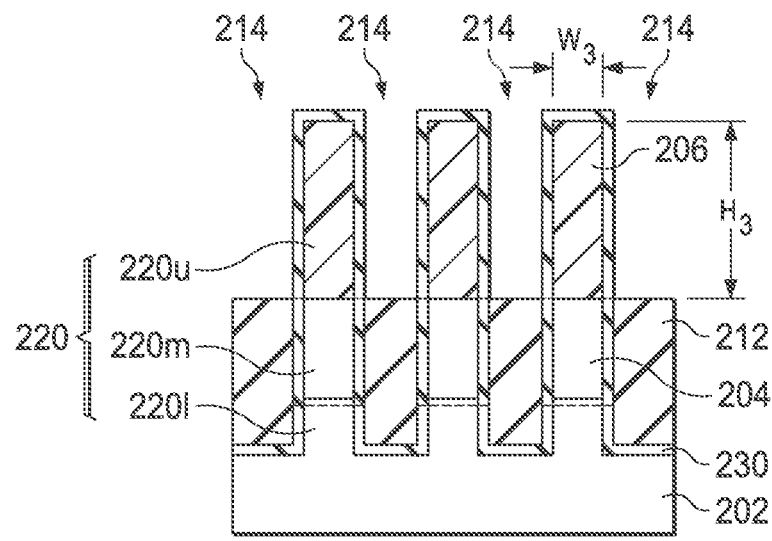

FIG. 7 depicts the resulting structure after forming a dielectric material 212 in the trenches 210, such as discussed above with reference to step 110 of FIG. 1. The dielectric material 212 may include silicon oxide, and hence is also referred to as STI oxide 212 in the present disclosure. In some embodiments, other dielectric materials, such as silicon nitride, silicon oxynitride, fluoride-doped silicate glass (FSG), or a low-K dielectric material, may also be used. In some embodiments, the STI oxide 212 may be formed using a spin-on-dielectric (SOD) process, such as hydrogen silsesquioxane (HSQ) or methyl silsesquioxane (MSQ). In other embodiments, the STI oxide 212 may be formed using a high-density-plasma (HDP) CVD process, using silane ($SiH_4$) and oxygen ($O_2$) as reacting precursors. In other embodiments, the STI oxide 212 may be formed using a sub-atmospheric CVD (SACVD) process or high aspectratio process (HARP), wherein process gases may comprise tetraethylorthosilicate (TEOS) and ozone ($O_3$).

In an embodiment, the STI oxide 212 is formed to a thickness greater than a height of the fins 220 and subsequently recessed using a planarization process and an etch process. The planarization process, such as a CMP, reduces the STI oxide 212 to an upper surface of the first passivation layer 230. A subsequent etch process reduces the height of the STI oxide 212 to expose portions of the sidewalls of the fin 220, resulting in recesses 214.

In some embodiments, the etching step may be performed using a wet etching process, for example, by dipping the substrate 202 in dilute hydrofluoric acid (HF). In some embodiments, the etching step may be performed using a vapor etching process, for example, the vapor etching process may be performed using HF as etching gas.

In an embodiment, the STI oxide 212 is recessed such that an upper surface of the STI oxide 212 is at or below an interface between the upper fin portion 220$u$ and the middle fin portion 220$m$. In an embodiment, a height $H_3$ of the exposed fin is about 10 nm to about 50 nm, and width $W_3$ is about 6 nm to about 20 nm.

Figure 8:
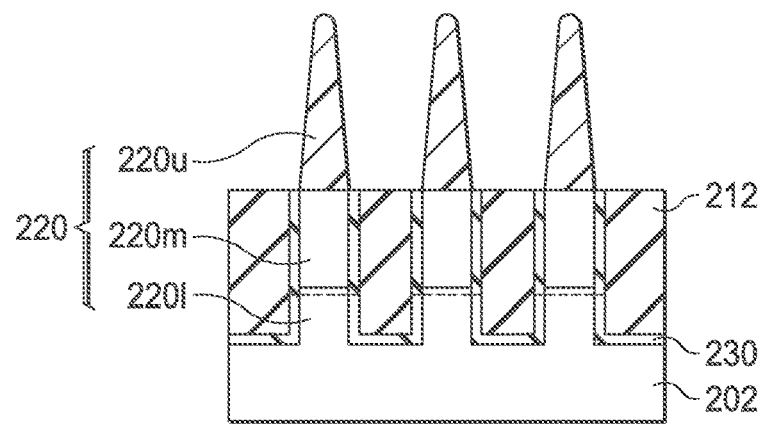

Referring now to FIG. 8, a fin reshaping process is performed in accordance with an embodiment, and as discussed above with reference to step 112 of FIG. 1. The reshaping process results in multiple crystal facets being exposed along a surface of the fin 220. For example, in an embodiment an upper surface of the fin 220 may have a crystal orientation of (001) and a sidewall of the fin 220 may have a crystal orientation of (110). Between these crystal orientations, the fin surface may also exhibit crystal orientations of (113) and (111). By reshaping the fin, higher mobility may be obtained as compared to unshaped fins. In an embodiment in which the upper fin portion 220$u$ comprises germanium, the reshaping may be performed using a wet etch of hot ammonia at a temperature of 20° C. to about 100° C. Such an etch process removes the upper passivation portion 230$u$ and reshapes the upper fin portion 220$u$. As a result of the reshaping process, exposed portions of the fin 220 exhibits slanted sidewalls.

Figure 9:
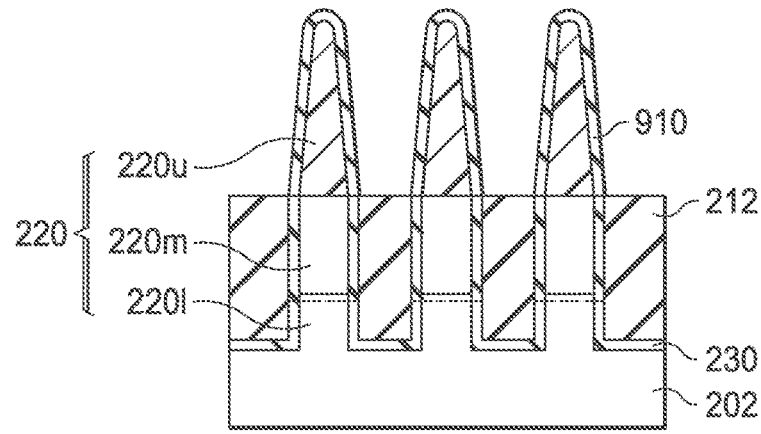

FIG. 9 illustrates a second passivation process in accordance with an embodiment, and as discussed above with reference to step 112 of FIG. 1. The second passivation process results in a second passivation layer 910 formed on exposed surfaces of the reshaped fin, the upper fin portion 220$u$ in the illustrated embodiment. The second passivation process may use similar processes as the first passivation process discussed above with reference to FIG. 6. The second passivation layer 910 may have a thickness of about 0.5 nm to about 5 nm.

In some embodiments, the second passivation layer 910 comprises $GeO_xN_y$, wherein the ratio of y:x (N:O) is about 0.25 to about 0.9. A ratio such as this has been found to allow for a Dit (interface trap density—a measure of dangling bond concentration per $cm^2$) of about 1E10/cm2, whereas without the second passivation layer the Dit may be less than 1E12, such as about 1E11.

Furthermore, the y:x ratio of the second passivation layer along a top surface of the upper fin portion 220$u$ may be adjusted to be different from the y:x ratio of the second passivation layer along sidewalls of the upper fin portion 220$u$. The y:x ratio of the second passivation layer oxynitride may be controlled through process condition adjustment, such as plasma power or temperature. In some embodiments, a first ratio of y:x of the second passivation layer 910 along an upper surface of the upper fin portion 220$u$ is equal to or greater than a second ratio of y:x of the second passivation layer 910 along sidewalls of the upper fin portion 220$u$. In some embodiments, a ratio of the first ratio to the second ratio is from about 1 to about 1.3. In some embodiments, a higher y:x ratio may result in a lower etching rate or lower thermal effect.

Figure 10:
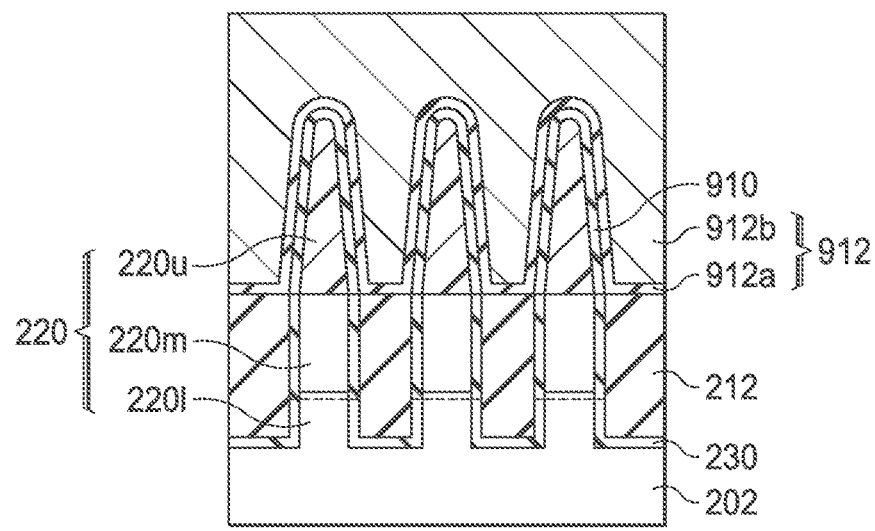

Thereafter, additional processes may be performed. For example, FIG. 10 illustrates a gate structure 912 formed over portions of the fin 220. Portions of the upper fin portion 220$u$ comprise source/drain (S/D) regions along either side of the gate electrode 912$b$, and a channel region extends between the S/D regions below the gate electrode 912. In some embodiments, the gate structure 912 comprises a gate dielectric 912$a$ and a gate electrode 912$b$ as shown in FIG. 10.

As illustrated in FIG. 10 the first passivation layer and/or the second passivation layer over the fin structure 220 to impede generation of the interface traps between the fin 220 and STI oxide 212, or another overlying dielectric (e.g., an interlayer dielectric), problems associated with high leakage current due to high interface traps may be reduced and/or avoided, thereby resulting in increased device performance characteristics, such as low leakage.

It is understood that the FinFET 200 may undergo further processes. For example, CMOS processes may be performed to form various features such as contacts/vias, interconnect metal layers, dielectric layers, passivation layers, etc.

FIGS. 11-18 illustrate various intermediate process steps of another embodiment. As discussed above, FIGS. 3-10 illustrate an embodiment in which the fins 220 comprise a lower fin portion 220$l$, a middle fin portion 220$m$, and a upper fin portion 220$u$, wherein each has a different composition. As explained below FIGS. 11-18 illustrate an embodiment in which the fins will be formed of two different materials, rather than the three different materials as illustrated in FIGS. 3-10. Where appropriate, reference is made to the structures and processes described above, wherein like reference numerals refer to like elements unless otherwise noted.

Figure 11:
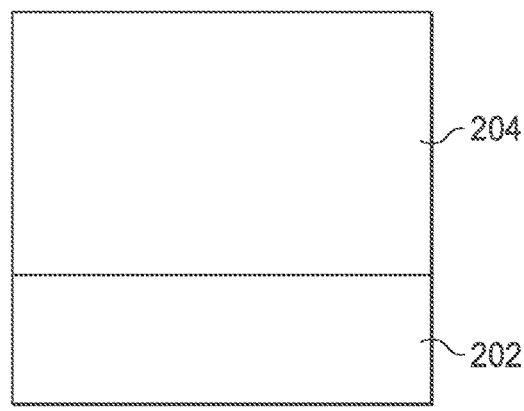
FIGS. 11-18 are cross-sectional views of a FinFET at various stages of fabrication according to various other embodiments of the present disclosure.

Referring first to FIG. 11, there is shown the substrate 202 having the second semiconductor material 204 (also referred to as the silicon germanium layer 204) formed thereon. As discussed above the substrate 202 may be formed of silicon and the second semiconductor material 204 may be formed of silicon germanium, wherein similar processes as described above with reference to FIG. 3 may be used.

In this embodiment, the silicon germanium layer 204 may be epitaxially grown to a thickness of about 20 nm to about 50 nm. The silicon germanium layer 204 may exhibit a strained surface and have a concentration of germanium from about 25% to about 75%.

Figure 12:
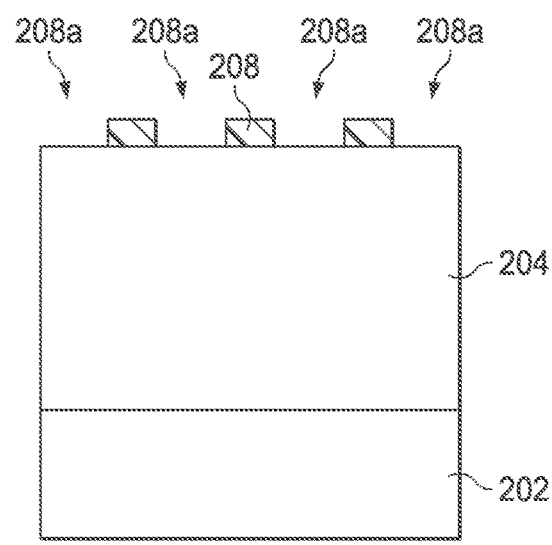
Figure 13:
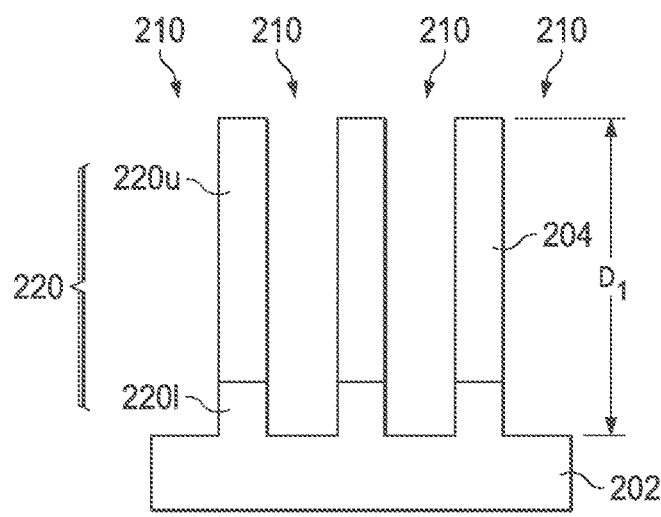

FIGS. 12 and 13 illustrate the patterning of the substrate 202 and the silicon germanium layer 204, thereby forming trenches 210 interposed between fins 220. In this embodiment as illustrated in FIG. 13, the fins 220 comprise a lower fin portion 220$l$ and a upper fin portion 220$u$. In an embodiment, the lower fin portion 220$l$ is formed from a silicon substrate and may be patterned in a similar manner as the lower fin portion 220$l$ discussed above with reference to FIGS. 4 and 5, and the upper fin portion 220$u$ is formed from a silicon germanium material and may be patterned in a similar manner as the middle fin portion 220$m$ (formed also of silicon germanium) discussed above with reference to FIGS. 4 and 5. It is noted that for convenience, that FIGS. 13-18 refer to a upper fin portion 220$u$, although the material of the upper fin portion 220$u$ may be different than the material of the upper fin portion 220$u$ referred to in FIGS.

5-10. It is also noted that other materials may be used. In an embodiment a depth $D_1$ of the trench is about 20 nm to about 120 nm.

Figure 14:
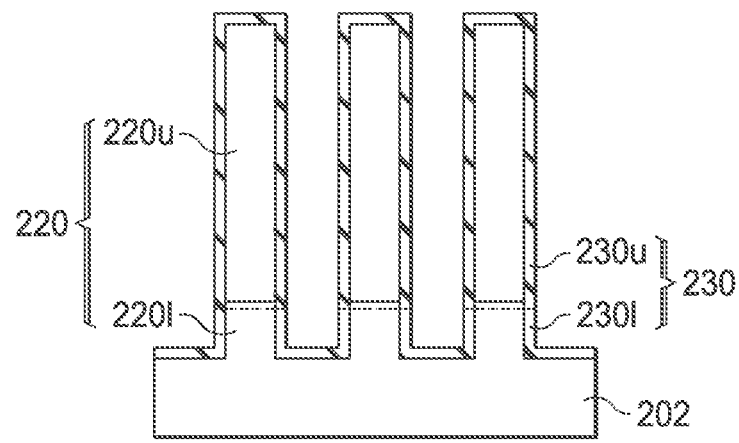

FIG. 14 illustrates a first passivation process to form a first passivation layer 230 in accordance with an embodiment. Similar processes as those disclosed above with reference to FIG. 6 may be used. In an embodiment, the first passivation layer 230 comprises an oxynitride. For example, in an embodiment in which the lower fin portion 220*l* comprises a silicon substrate, a lower passivation portion 230*l* may be formed of silicon oxynitride and in an embodiment in which the upper fin portion 220*u* comprises silicon germanium, an upper passivation portion 230*u* may be formed of silicon germanium oxynitride.

Figure 15:
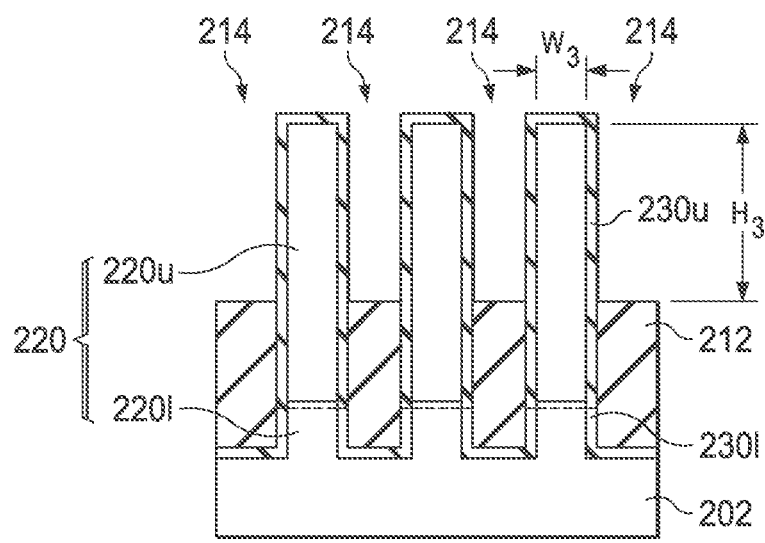

FIG. 15 illustrates forming an STI oxide 212 in the trenches 210 (see FIG. 14), creating recesses 214, in accordance with an embodiment. Similar processes as those disclosed above with reference to FIG. 7 may be used. In an embodiment, a height $H_3$ of the fin 220 above an upper surface of the STI oxide 212 is about 10 nm to about 50 nm, and a width $W_3$ of 6 nm to about 20 nm.

Figure 16:
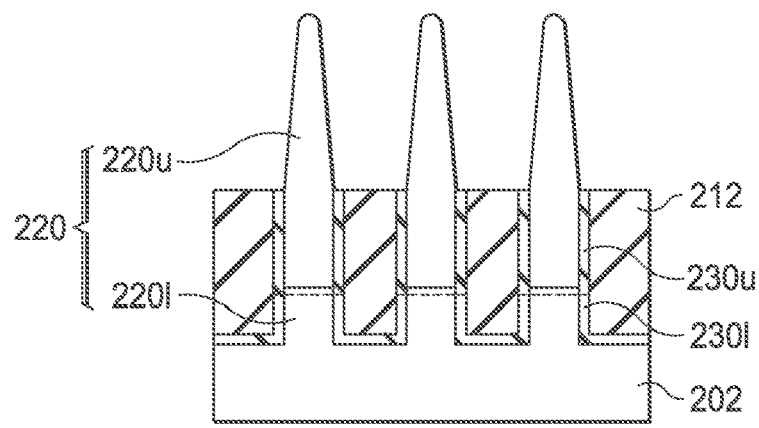
Figure 17:
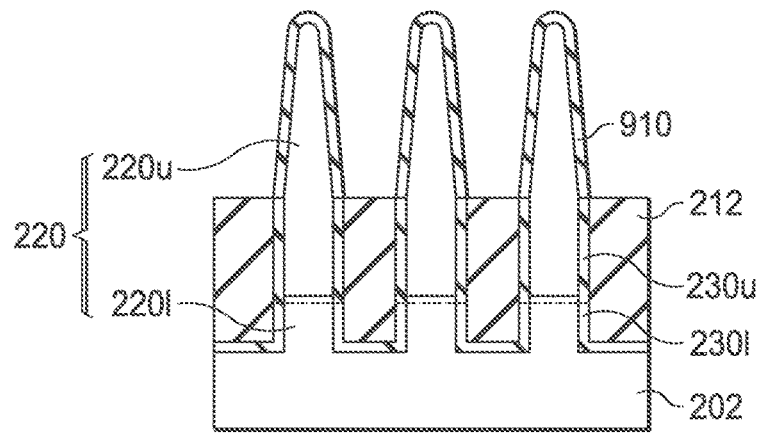

FIG. 16 illustrates a fin reshaping process and FIG. 17 illustrates a second passivation process to form a second passivation layer 910 in accordance with an embodiment. Similar processes as those disclosed above with reference to FIGS. 8 and 9 may be used.

Figure 18:
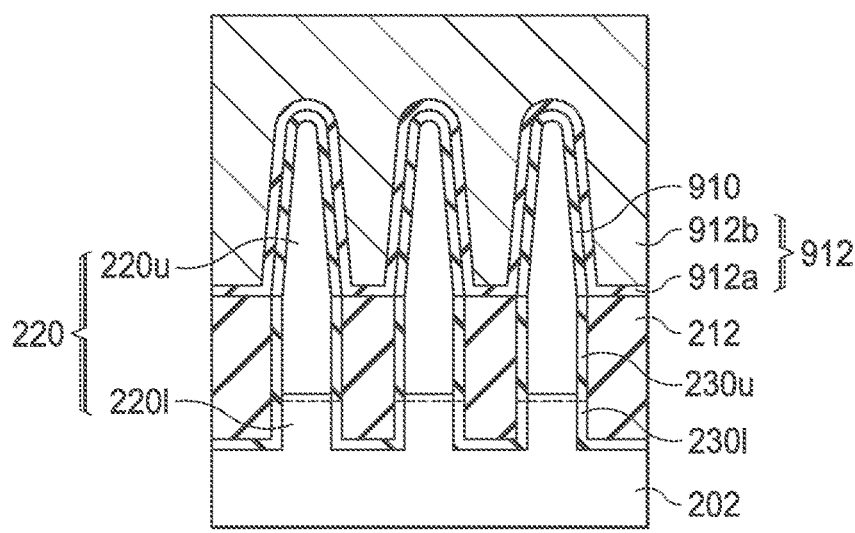

Thereafter, additional processes may be performed. For example, FIG. 18 illustrates a gate structure 912 formed over portions of the fin 220. Similar processes and structures may be used as discussed above with reference to FIG. 10.

FIGS. 19-26 illustrate various intermediate process steps of another embodiment. As discussed above, FIGS. 3-10 illustrate an embodiment in which the fins 220 comprise a lower fin portion 220*l*, a middle fin portion 220*m*, and a upper fin portion 220*u*, wherein each has a different composition, and FIGS. 11-18 illustrate an embodiment in which the fins 220 comprise a lower fin power 220*l* and a upper fin portion 220*u*. As explained below FIGS. 19-26 illustrate an embodiment in which the fins will be formed of two different materials wherein the elemental concentrations of one element varies, rather than the three different materials as illustrated in FIGS. 3-10 and two different materials as illustrated in FIGS. 11-18. Where appropriate, reference is made to the structures and processes described above, wherein like reference numerals refer to like elements unless otherwise noted.

Figure 19:
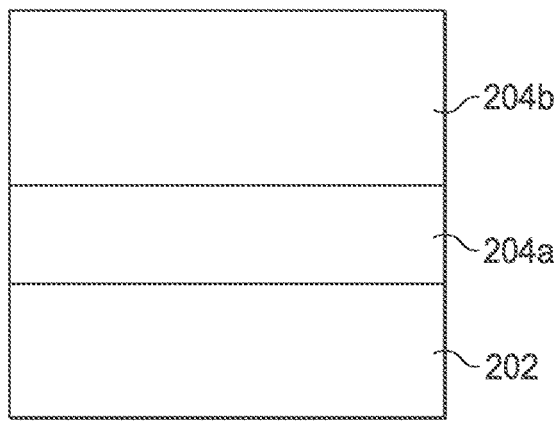
FIGS. 19-26 are cross-sectional views of a FinFET at various stages of fabrication according to various other embodiments of the present disclosure.

Referring first to FIG. 19, there is shown the substrate 202 having the second semiconductor material 204 (also referred to as the silicon germanium layer 204) formed thereon. As discussed above the substrate 202 may be formed of silicon and the second semiconductor material 204 may be formed of silicon germanium, wherein similar processes as described above with reference to FIG. 3 may be used.

In this embodiment, the silicon germanium layer 204 comprises a first silicon germanium layer ($Si_{x1}Ge_{y1}$) 204*a* and a second silicon germanium layer ($Si_{x2}Ge_{y2}$) 204*b*, wherein the relative concentrations of germanium differs between the first silicon germanium layer 204*a* and the second silicon germanium layer 204*b*. The first silicon germanium layer 204*a* may act as a buffer layer to the second germanium layer 204*b* to reduce defects and to control the strain in a surface of the second germanium layer 204*b*. In an embodiment, y1 is less than y2, thereby creating a compressive strain in a surface of the second germanium layer 204*b*. In an embodiment, y2 is less than y1, thereby creating a tensile strain in a surface of the second germanium layer 204*b*.

In an embodiment, the first silicon germanium layer 204*a* may be epitaxially grown to a thickness of about 20 nm to about 50 nm and the second silicon germanium layer 204*b* may be epitaxially grown to a thickness of about 20 nm to about 50 nm.

Figure 20:
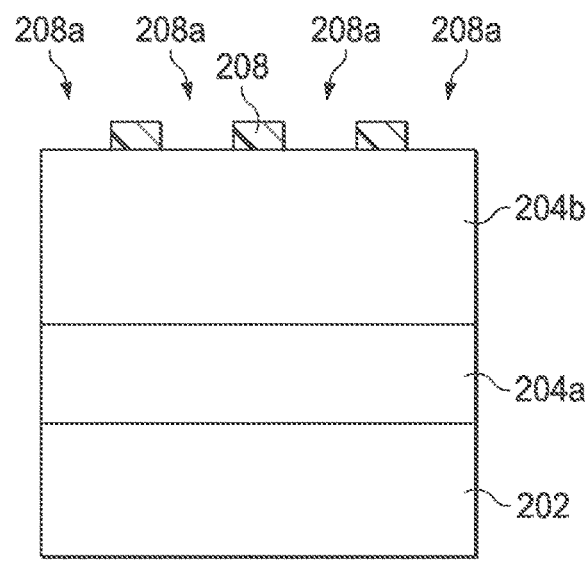
Figure 21:
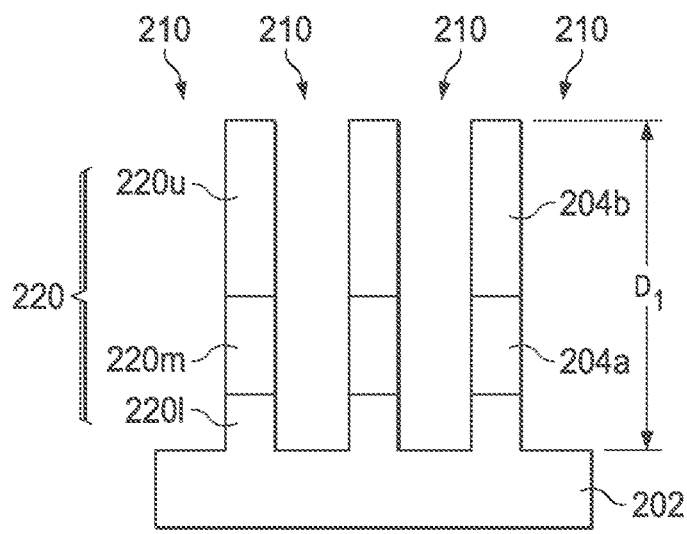

FIGS. 20 and 21 illustrate the patterning of the substrate 202, the first silicon germanium layer 204*a* and the second silicon germanium layer 204*b*, thereby forming trenches 210 interposed between fins 220. In the illustrated embodiment, the fins 220 comprises a lower fin portion 220*l*, a middle fin portion 220*m*, and a upper fin portion 220*u*, formed from the substrate 202, the first silicon germanium layer 204*a* and the second silicon germanium layer 204*b*, respectively. It is noted that for convenience, that FIGS. 21-26 refer to a middle fin portion 220*m* and a upper fin portion 220*u*, although the material of the middle fin portion 220*m* and the upper fin portion 220*u* of FIGS. 21-26 may be different than the material of the middle fin portion 220*m* and the upper fin portion 220*u* referred to in FIGS. 5-10. In an embodiment in which the substrate 202 is a silicon substrate, the substrate 202 may be etched as discussed above with reference to FIGS. 4 and 5. In an embodiment in which the first silicon germanium layer 204*a* and the second silicon germanium layer 204*b* are formed of silicon germanium, the first silicon germanium layer 204*a* and the second silicon germanium layer 204*b* may be etched in a similar manner as the silicon germanium layer discussed above with reference to FIGS. 4 and 5. In an embodiment a depth D1 of the trench is about 20 nm to about 120 nm.

Figure 22:
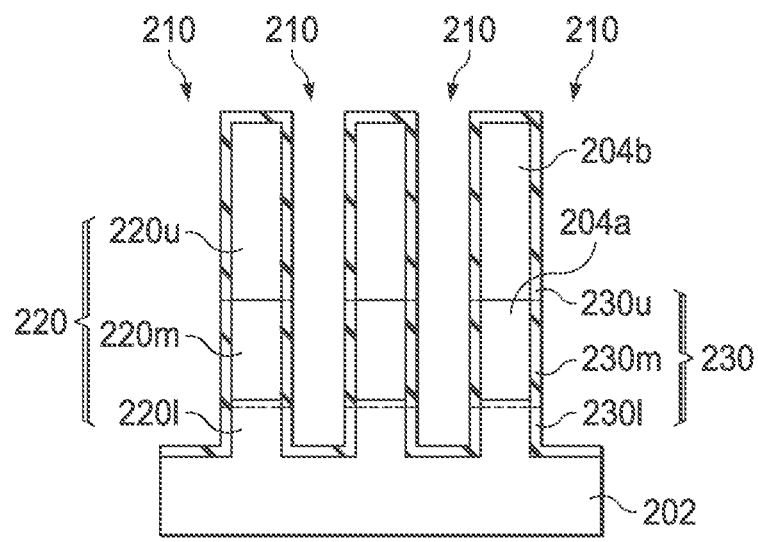

FIG. 22 illustrates a first passivation process to form a first passivation layer 230 in accordance with an embodiment. Similar processes as those disclosed above with reference to FIG. 6 may be used. In this embodiment, the first passivation process results in a lower passivation portion 230*l*, a middle passivation portion 230*m*, and an upper passivation portion 220*u*, although the middle passivation portion 230*m* and the upper passivation portion 230*u* of this embodiment may correspond to different materials than the middle passivation portion 230*m* and the upper passivation portion 230*u* of FIG. 6. In this embodiment, the concentration of Ge in the SiGeON layer may vary according to the concentration of Ge in the first silicon germanium layer 204*a* and the second silicon germanium layer 204*b*. For example, the upper passivation portion 220*u* over the first silicon germanium layer 204*a* may be expressed as $Si_{x1}Ge_{y1}ON$ and the middle passivation portion 220*u* over the second silicon germanium layer 204*b* may be expressed as $Si_{x2}Ge_{y2}ON$.

Figure 23:
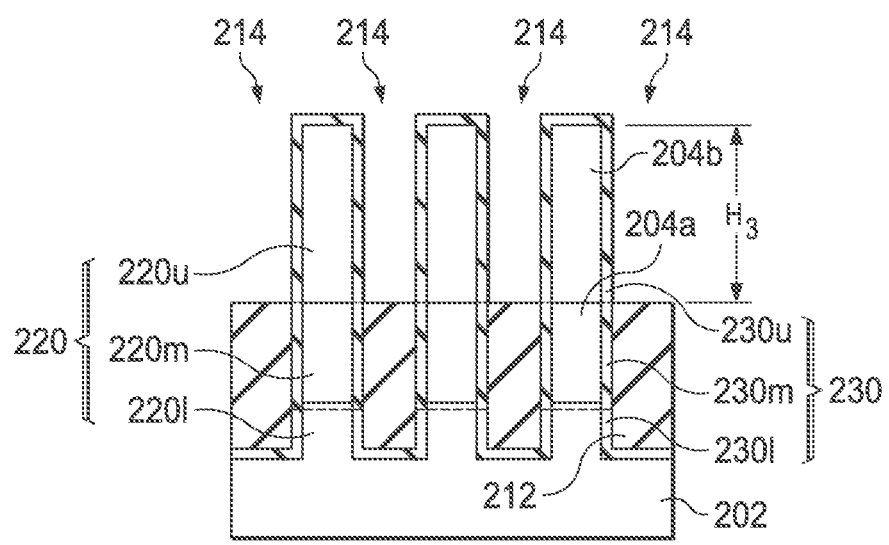

FIG. 23 illustrates forming an STI oxide 212 in the trenches 210 (see FIG. 22), creating recesses 214, in accordance with an embodiment. Similar processes as those disclosed above with reference to FIG. 7 may be used. In an embodiment, a height $H_3$ of the fin 220 above an upper surface of the STI oxide is about 20 nm to about 50 nm.

Figure 24:
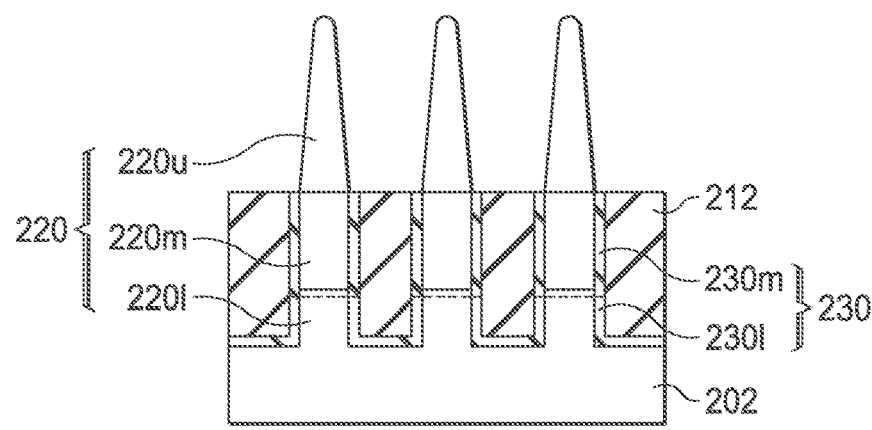
Figure 25:
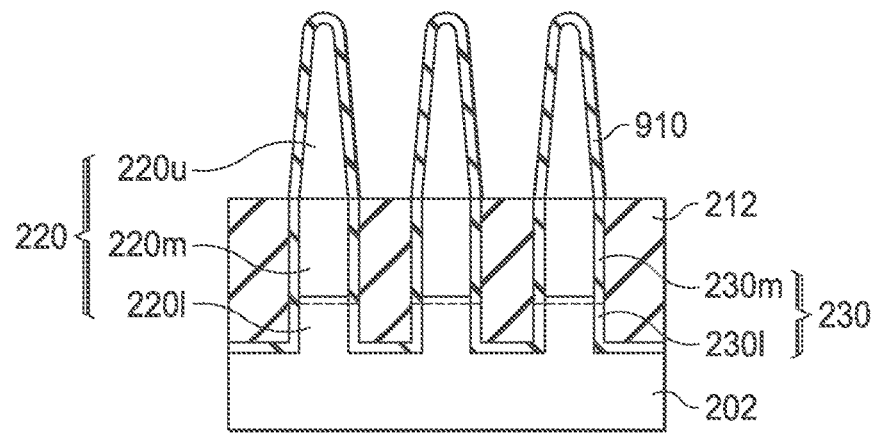

FIG. 24 illustrates a fin reshaping process and FIG. 25 illustrates a second passivation process to form a second passivation layer 910 in accordance with an embodiment. Similar processes as those disclosed above with reference to FIGS. 8 and 9 may be used.

Figure 26:
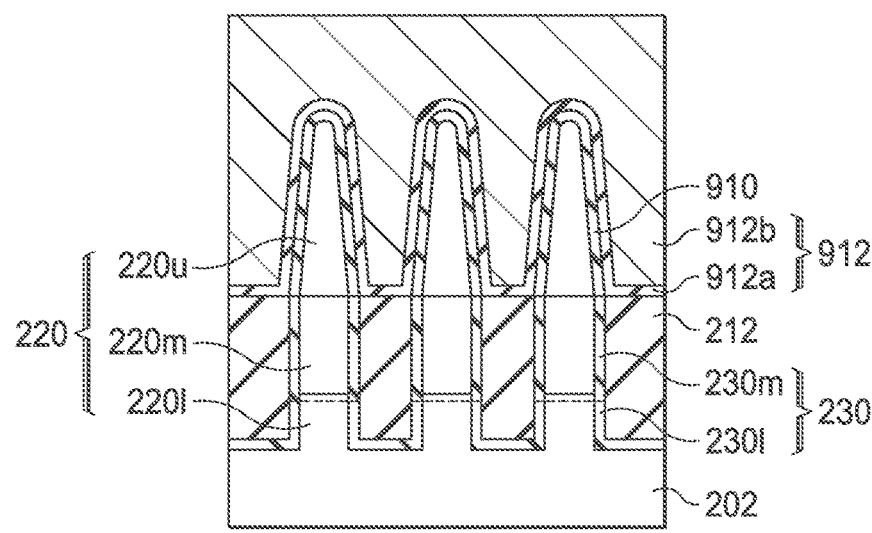

Thereafter, additional processes may be performed. For example, FIG. 26 illustrates a gate structure 912 formed over portions of the fin 220. Similar processes and structures may be used as discussed above with reference to FIG. 10.

The embodiments discussed above may be selected for a particular application. For example, an embodiment utilizing a Ge fin may be better suited for an N-FET, whereas SiGe may be better suited for a P-FET. Particular embodiments may be selected to achieve the desired strain and defect control. Furthermore, the percentage of Ge in SiGe may be adjusted to obtain the desired strain.

In an embodiment, a FinFET is provided. The FinFET comprises a substrate and a fin structure protruding from the substrate, the fin structure comprising one or more semiconductor layers, each of the semiconductor layers having a different lattice constant of a corresponding immediately underlying layer. An isolation region is adjacent opposing sidewalls of the fin structure, the fin structure having an upper portion extending above the isolation region, the upper portion having slanted sidewalls. A first passivation layer is interposed between the fin structure and the isolation region, and a second passivation layer is on the upper portion of the fin structure. A gate structure overlies the upper portion of the fin structure. The fin structure may comprise, for example, a silicon germanium layer on a silicon substrate and a germanium layer on the silicon germanium layer. In other embodiments, the fin structure may comprise a silicon germanium layer on a silicon substrate. In in yet other embodiments, the fin structure may comprise multiple silicon germanium layers having different germanium concentrations on a silicon substrate.

In yet other embodiments, a method of forming a FinFET is provided. The method includes providing a substrate and forming one or more fins extending from the substrate, each of the one or more fins having one or more semiconductor layers overlying the substrate, each of the one or more fins having a lattice constant different than a lattice constant of an underlying layer. A first passivation layer is formed over the one or more fins, and isolation regions are formed along opposing sidewalls of the one or more fins such that the one or more fins extending above an uppermost surface of the isolation regions. A reshaping process is performed on exposed portions of the one or more fins, and a second passivation layer is formed over the reshaped exposed portions of the one or more fins.

In yet still other embodiments, a FinFET is provided. The FinFET includes a substrate, a fin structure protruding from the substrate, the fin structure comprising one or more semiconductor layers, each of the semiconductor layers having a different lattice constant of an immediately underlying layer, and an isolation region adjacent opposing sidewalls of the fin structure, the fin structure having an upper portion extending above the isolation region, the upper portion having slanted sidewalls. The FinFET further includes a first passivation layer interposed between the fin structure and the isolation region and a second passivation layer on the upper portion of the fin structure. A gate structure overlies the upper portion of the fin structure.

In yet still other embodiments, a FinFET is provided. The FinFET includes a substrate having a fin structure, the fin structure comprising one or more semiconductor layers, each of the semiconductor layers having a different lattice constant of an immediately underlying layer, the fin structure having a lower portion and an upper portion, the upper portion having a lesser slope than the lower portion and an isolation region adjacent opposing sidewalls of the fin structure, an upper surface of the isolation region being level with a junction between the upper portion and the lower portion. The FinFET further includes a first passivation layer interposed between the fin structure and the isolation region and a second passivation layer on the upper portion of the fin structure. A gate structure overlies the upper portion of the fin structure.

In yet still other embodiments, a FinFET is provided. The FinFET includes a fin structure comprising one or more semiconductor layers, each overlying semiconductor layer of the one or more semiconductor layers having a different lattice constant of a corresponding immediately underlying semiconductor layer of the one or more semiconductor layers, the fin structure having a lower portion and an upper portion. The FinFET further includes a first passivation layer along sidewalls of the lower portion of the fin structure, an isolation region over the first passivation layer along opposing sidewalls of the fin structure, and a second passivation layer on sidewalls of the upper portion of the fin structure, an interface between the first passivation layer and the second passivation layer being aligned with an upper surface of the isolation region. A gate dielectric layer overlies the second passivation layer, and a gate electrode overlies the gate dielectric layer.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fin field effect transistor (FinFET) comprising:
   a substrate;
   a fin structure protruding from the substrate, the fin structure comprising one or more semiconductor layers, each of the one or more semiconductor layers having a different lattice constant than an immediately underlying layer;
   an isolation region on opposing sides of the fin structure, wherein the fin structure has a first sidewall profile extending from an upper surface of the fin structure to a bottom of the isolation region along a shortest path, the first sidewall profile having an upper portion and a lower portion, a slope of the upper portion of the first sidewall being different than a slope of the lower portion of the first sidewall, the upper portion of the first sidewall profile being a sidewall of a channel region, wherein the fin structure comprises a lower portion of the fin structure below the channel region;
   a gate structure overlying the upper portion of the first sidewall profile and overlying the isolation region, wherein the gate structure comprises a gate dielectric layer and a gate electrode;
   a first passivation layer interposed between the isolation region and the lower portion of the first sidewall profile; and
   a second passivation layer interposed between the gate structure and the upper portion of the first sidewall profile, wherein the channel region comprises a germanium layer, the lower portion of the fin structure comprises a silicon germanium layer, the second passivation layer comprises GeON, and the first passivation layer comprises SiGeON.

2. The FinFET of claim 1, wherein the fin structure comprises a first semiconductor layer and a second semiconductor layer, wherein the point is level with an interface between the first semiconductor layer and the second semiconductor layer.

3. A fin field effect transistor (FinFET) comprising:
   a substrate;
   a fin structure protruding from the substrate, the fin structure comprising one or more semiconductor layers, each of the one or more semiconductor layers having a different lattice constant than an immediately underlying layer;
an isolation region on opposing sides of the fin structure, wherein the fin structure has a first sidewall profile extending from an upper surface of the fin structure to a bottom of the isolation region along a shortest path, the first sidewall profile having an upper portion and a lower portion, a slope of the upper portion of the first sidewall being different than a slope of the lower portion of the first sidewall, the upper portion of the first sidewall profile being a sidewall of a channel region, wherein the fin structure comprises a lower portion of the fin structure below the channel region;
a gate structure overlying the upper portion of the first sidewall profile and overlying the isolation region, wherein the gate structure comprises a gate dielectric layer and a gate electrode;
a first passivation layer interposed between the isolation region and the lower portion of the first sidewall profile; and
a second passivation layer interposed between the gate structure and the upper portion of the first sidewall profile, wherein the channel region comprises an upper section of a silicon germanium layer, the lower portion of the fin structure comprises a lower section of the silicon germanium layer, the first passivation layer comprises SiGeON, and the second passivation layer comprises SiGeON.

4. A fin field effect transistor (FinFET) comprising:
a substrate;
a fin structure protruding from the substrate, the fin structure comprising one or more semiconductor layers, each of the one or more semiconductor layers having a different lattice constant than an immediately underlying layer;
an isolation region on opposing sides of the fin structure, wherein the fin structure has a first sidewall profile extending from an upper surface of the fin structure to a bottom of the isolation region along a shortest path, the first sidewall profile having an upper portion and a lower portion, a slope of the upper portion of the first sidewall being different than a slope of the lower portion of the first sidewall, the upper portion of the first sidewall profile being a sidewall of a channel region, wherein the fin structure comprises a lower portion of the fin structure below the channel region;
a gate structure overlying the upper portion of the first sidewall profile and overlying the isolation region, wherein the gate structure comprises a gate dielectric layer and a gate electrode;
a first passivation layer interposed between the isolation region and the lower portion of the first sidewall profile; and
a second passivation layer interposed between the gate structure and the upper portion of the first sidewall profile, wherein the channel region comprises a first $Si_{x1}Ge_{y1}$ layer, the lower portion of the fin structure comprises a second $Si_{x2}Ge_{y2}$ layer, the first passivation layer comprises SiGeON, and the second passivation layer comprises SiGeON, wherein x1 is less than y1.

5. A fin field effect transistor (FinFET) comprising:
a substrate;
a fin structure protruding from the substrate, the fin structure comprising one or more semiconductor lay-ers, each of the one or more semiconductor layers having a different lattice constant than an immediately underlying layer;
an isolation region on opposing sides of the fin structure, wherein the fin structure has a first sidewall profile extending from an upper surface of the fin structure to a bottom of the isolation region along a shortest path, the first sidewall profile having an upper portion and a lower portion, a slope of the upper portion of the first sidewall being different than a slope of the lower portion of the first sidewall, the upper portion of the first sidewall profile being a sidewall of a channel region, wherein the fin structure comprises a lower portion of the fin structure below the channel region;
a gate structure overlying the upper portion of the first sidewall profile and overlying the isolation region, wherein the gate structure comprises a gate dielectric layer and a gate electrode;
a first passivation layer interposed between the isolation region and the lower portion of the first sidewall profile; and
a second passivation layer interposed between the gate structure and the upper portion of the first sidewall profile, wherein the channel region comprises a first $Si_{x1}Ge_{y1}$ layer, the lower portion of the fin structure comprises a second $Si_{x2}Ge_{y2}$ layer, the first passivation layer comprises SiGeON, and the second passivation layer comprises SiGeON, wherein x1 is greater than y1.

6. A fin field effect transistor (FinFET) comprising:
a substrate having a fin structure, the fin structure having a first section, the first section of the fin structure comprising one or more semiconductor layers, each of the one or more semiconductor layers having a different lattice constant than an immediately underlying layer;
a gate structure overlying an entirety of the first section of the fin structure in a plan view;
isolation regions along opposing sides of the first section of the fin structure, wherein opposing lower sidewalls of the first section of the fin structure below an upper surface of the isolation regions are parallel, wherein opposing upper sidewalls of the first section of the fin structure above the upper surface of the isolation regions taper toward each other as the opposing upper sidewalls extend away from the upper surface of the isolation regions;
a first passivation layer interposed between the first section of the fin structure and the isolation regions, wherein the first passivation layer comprises a first oxynitride layer and a second oxynitride layer, wherein the first oxynitride layer and the second oxynitride layer comprise a silicon germanium oxynitride layer; and
a second passivation layer interposed between the first section of the fin structure and the gate structure.

7. A fin field effect transistor (FinFET) comprising:
a substrate having a fin structure, the fin structure having a first section, the first section of the fin structure comprising one or more semiconductor layers, each of the one or more semiconductor layers having a different lattice constant than an immediately underlying layer;
a gate structure overlying an entirety of the first section of the fin structure in a plan view;
isolation regions along opposing sides of the first section of the fin structure, wherein opposing lower sidewalls of the first section of the fin structure below an upper surface of the isolation regions are parallel, wherein opposing upper sidewalls of the first section of the fin structure above the upper surface of the isolation regions taper toward each other as the opposing upper sidewalls extend away from the upper surface of the isolation regions;

a first passivation layer interposed between the first section of the fin structure and the isolation regions, wherein the first passivation layer comprises a first oxynitride layer and a second oxynitride layer, wherein the first oxynitride layer comprises a silicon oxynitride layer and the second oxynitride layer comprises a silicon germanium oxynitride layer; and a second passivation layer interposed between the first section of the fin structure and the gate structure.

8. A fin field effect transistor (FinFET) comprising:

a substrate having a fin structure, the fin structure having a first section, the first section of the fin structure comprising one or more semiconductor layers, each of the one or more semiconductor layers having a different lattice constant than an immediately underlying layer;

a gate structure overlying an entirety of the first section of the fin structure in a plan view;

isolation regions along opposing sides of the first section of the fin structure, wherein opposing lower sidewalls of the first section of the fin structure below an upper surface of the isolation regions comprise parallel sidewalls, wherein opposing upper sidewalls of the first section of the fin structure above the upper surface of the isolation regions comprise tapered sidewalls tapering toward each other as the opposing upper sidewalls extend away from the upper surface of the isolation regions, wherein the parallel sidewalls contact the tapered sidewalls at a point level with the upper surface of the isolation regions;

a first passivation layer interposed between the first section of the fin structure and the isolation regions; and a second passivation layer interposed between the first section of the fin structure and the gate structure, wherein the one or more semiconductor layers comprises a first semiconductor layer and a second semiconductor layer on the first semiconductor layer, wherein the first semiconductor layer comprises a first semiconductor material, wherein the second semiconductor layer comprises a second semiconductor material, wherein the first passivation layer comprises a first oxynitride of the first semiconductor material, wherein the second passivation layer comprises a second oxynitride of the second semiconductor material, wherein a first height of the first passivation layer is greater than a second height of the first semiconductor material.

9. The FinFET of claim 8, wherein a ratio of the first height to the second height is from about 1 to about 1.2.

10. The FinFET of claim 8, wherein the gate structure comprises a gate dielectric and a gate electrode.

11. The FinFET of claim 8, wherein the first passivation layer comprises a different material than a material of the second passivation layer.

12. The FinFET of claim 8, wherein a thickness of the first passivation layer and a thickness of the second passivation layer are greater than or equal to 0.5 nm and less than or equal to 5 nm.

13. The FinFET of claim 8, wherein the one or more semiconductor layers comprise a first semiconductor layer and a second semiconductor layer, wherein a second interface between the first semiconductor layer and the second semiconductor layer is level with the upper surface of the isolation region.

* * * * *